(12) United States Patent
Chen et al.

(10) Patent No.: US 7,186,662 B2  
(45) Date of Patent: Mar. 6, 2007

(54) METHOD FOR FORMING A HARD MASK FOR GATE ELECTRODE PATTERNING AND CORRESPONDING DEVICE

(75) Inventors: Chien-Hao Chen, Ilan County (TW); Chia-Jen Chen, Chiayi (TW); Tze-Liang Lee, Hsinchu (TW); Chao-Cheng Chen, Shin-Chu County (TW); Shih-Chang Chen, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 10/964,841

(22) Filed: Oct. 13, 2004

(65) Prior Publication Data

US 2006/0081917 A1    Apr. 20, 2006

(51) Int. Cl.
*H01L 21/461*    (2006.01)

(52) U.S. Cl. ..................................... 438/738; 438/757
(58) Field of Classification Search ................ 438/738, 438/757
See application file for complete search history.

(56) References Cited

U.S. PATENT DOCUMENTS 6,403,485 B1 * 6/2002 Quek et al. ................. 438/692

* cited by examiner

*Primary Examiner*—N. Drew Richards
(74) *Attorney, Agent, or Firm*—Haynes and Boone, LLP

(57) ABSTRACT

A method for forming a hard mask for gate electrode patterning in a semiconductor device is disclosed. The method includes providing a polysilicon layer to be etched and forming over the polysilicon layer, a nitride hardmask with a relatively high etch rate to hydrofluoric acid, as compared to the etch rate of silicon oxide. The polysilicon can then be patterned using the hardmask and the hardmask can be removed using hydrofluoric acid.

20 Claims, 3 Drawing Sheets

METHOD FOR FORMING A HARD MASK FOR GATE ELECTRODE PATTERNING AND CORRESPONDING DEVICE

BACKGROUND

The present disclosure relates generally to the manufacturing of semiconductor devices, and more particularly to a method for using hard masks in patterning one or more layers in a semiconductor device.

The semiconductor integrated circuit (IC) industry has experienced rapid growth. Technological advances in IC materials and design have produced generations of ICs where each generation has smaller and more complex circuits than those from the previous generation. However, those advances have increased the complexity of processing and manufacturing ICs and, for those advances to be realized, similar developments in IC processing and manufacturing are necessary. For example, an IC is formed by creating one or more devices (e.g., circuit components) on a substrate using a fabrication process. As the geometry of such devices is reduced to the submicron or deep submicron level, the size and shape of different features of the device become critical.

In one example, polysilicon is often used as a gate electrode in a transistor device. As the gate width shrinks to below 100 nanometers, the roughness of the line edges ("line edge roughness", or LER) of the polysilicon gate structure adversely affects the performance of the transistor device. Specifically, LER can give a polysilicon gate different effective gate lengths, thereby modifying the transistor performance. This modification can result in a degradation in transistor delay time and saturation current (Id).

One solution for reducing LER is to use a SiO2 oxide hard mask when patterning a layer of polysilicon. In a typical process, a polysilicon layer is put down over a silicon substrate, the silicon substrate typically including a plurality of isolation regions, such as a shallow trench isolation (STI) filled with SiO2. After the polysilicon layer is patterned using the oxide hard mask, the hard mask is removed with a hydrofluoric acid (HF) wet etch process adapted for removing SiO2. Since the HF wet etch is adapted for removing SiO2, it also adversely affects the isolation regions, such as forming divots in the STI.

An alternative to the previously described solution is to use a hard mask formed of a nitride, such as SiN or SiON. Therefore, a wet etch process to remove the hard mask after patterning the polysilicon layer, such as H3PO4, will not adversely affect the SiO2 isolation regions. However, the H3PO4 wet etch process has poor selectivity and also etches a portion of the previously patterned polysilicon layer as well as the silicon substrate. As a result, there can be significant gate length variations and other distortions due to the roughened profile of the etched polysilicon layer, especially comparing n-type metal oxide semiconductor (NMOS) to p-type metal oxide semiconductor (PMOS). Also, the etching of the Si substrate may be undesirable for other reasons.

Accordingly, it is desirable to provide an improved system and method for forming a hard mask for patterning a gate electrode or for patterning other polysilicon structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
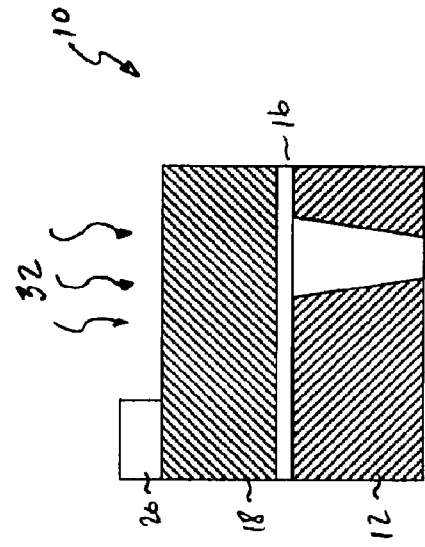
FIGS. 1–4 are cross-sectional diagrams of a semiconductor device being formed according to an embodiment of the present invention.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purposes of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, one example of a semiconductor device that can benefit from the present invention is a metal-oxide semiconductor field-effect transistor (MOSFET) 10. Other examples of devices that can benefit from the present invention include diodes, floating gate transistors, capacitors, resistors, and so forth.

In the present example, the MOSFET 10 is formed on a substrate 12. The substrate 12 may include silicon, silicon-on-insulator (SOI), silicon with defective crystalline, Ge, SiGe, strained Si, strained SiGe, GeOI, SiGeOI, diamond, and/or other suitable materials. The substrate 12 may be n-type doped or p-type doped.

The substrate 12 may be provided with one or more isolation features 14. In furtherance of the present example, the isolation feature 14 is a shallow trench isolation (STI). Other examples include local oxidation of silicon (LOCOS) structures, field oxide, and/or structures that are formed in the substrate 12 to electrically isolate device areas. It is understood that an isolation feature is not required to implement the present invention, but is merely described for the sake of example.

In furtherance of the example, a gate oxide layer 16 is deposited or formed over the substrate 12. The gate oxide layer 16 may include a variety of materials, including but not limited to, silicon dioxide ($SiO_2$), silicon nitride (SiN), silicon oxynitride (SiON), SiC, CN, and SiOC. Formation of the gate oxide layer 16 may include thermally oxidizing the substrate 12 to form thermal silicon oxide, then nitridizing the thermal silicon oxide in Nitrogen ambient to form silicon oxynitride. In some embodiments, no gate oxide layer may exist. In other embodiments, a gate dielectric may also be provided over the gate oxide layer 16. The gate dielectric may be a high-k dielectric (having a dielectric constant greater than that of the gate oxide layer 16, e.g., greater than 3.9).

In furtherance of the example, a polysilicon layer 18 is deposited on or over the gate oxide layer 16. The polysilicon layer 18 may be formed through a variety of methods, such as CVD, plasma vapor deposition (PVD), ALD, or other suitable methods. In one example, the layer of polysilicon 18 may be created at approximately between 470° C. to 770° C. As an alternative, other types of layers besides polysilicon can be used and still benefit from the present invention, including conductive and insulative layers.

Above the polysilicon layer 18 is a hard mask 20. In the present embodiment, the hard mask 20 is a film formed of a nitrogen-containing material, such as one formed of silicon nitride (SiN). The hard mask 20 is formed in a manner so that it has a high reactivity to a hydrofluoric (HF) wet etch. In one embodiment, the silicon nitride hard mask 20 has a HF etch rate of about 30–1000 Angstroms per minute at a dilution ratio of HF:H2O=1:100 (the HF is at 49% concentration) and at room temperature (25° C.). Also in the present embodiment, the hard mask 20 is formed to a thickness of about 10–200 nm using a low pressure chemical vapor deposition (LPCVD) process according to the equation (1) below:

$$HCD+NH3 \rightarrow SixNyHz \qquad (1)$$

The hard mask 20 can be formed by many different processes, including plasma-enhanced CVD, rapid thermal CVD, atomic layer deposition, and metal-organic CVD. The processes can use a nitrogen concentration from about 1–70% (atomic percentage). The processes can use one or more dopants, such as C, O, F, Cl, As, B, H, and Ge, and precursors, such as SiH4, disilane, dichlorosilane, hexachlorodisilane, bistertiarybutylamino silane, NH3, N2, or other silicon/nitrogen related precursors. Different temperatures can by chosen, as discussed below with reference to FIGS. 5 and 6, for different fabrication parameters, as desired. Also, the hardmask 20 can be a single layer, can be a multiple film stack, can receive various post treatment annealings, and/or can receive plasma treatments, as desired.

In the present embodiment, a layer of photoresist is provided above the hard mask 20. The photoresist 22 has been applied and patterned by conventional techniques, such as using a photolithography process, for subsequently patterning the hard mask 20. It is understood that the application and patterning of photoresist is well know in the art. It is also understood that other methods can be used to pattern the hard mask 20, and the photoresist 22 may not exist in some embodiments.

Using the patterned photoresist 22, a first etch process 30 is used to pattern the hard mask 20. In the present example, the first etch process 30 can be a phosphoric acid (H3PO4) etch for patterning the hard mask 20. However, in another embodiment, the first etch process 30 can be a hydrofluoric acid (HF) etch process.

Figure 2:
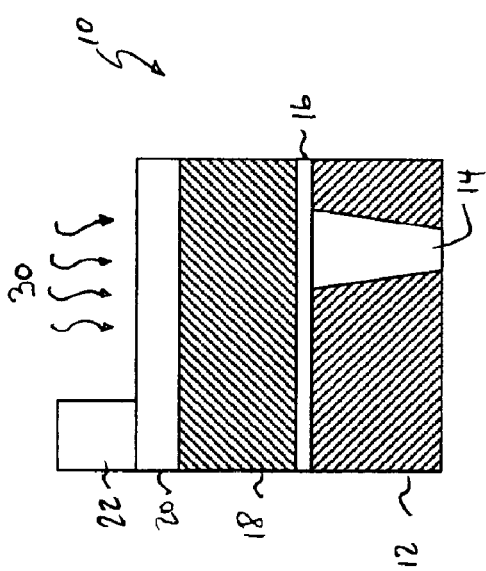

Referring now to FIG. 2, after the hard mask 20 has been patterned, a second etch process 32 is applied to the polysilicon layer 18. In the present example, the second etch process 32 is a dry etch process for removing polysilicon. There are several different dry etching techniques that can be used, including reactive ion etching (RIE), ion beam and plasma etching. It is understood that other removal processes can be used, including various types of wet etch.

Figure 3:
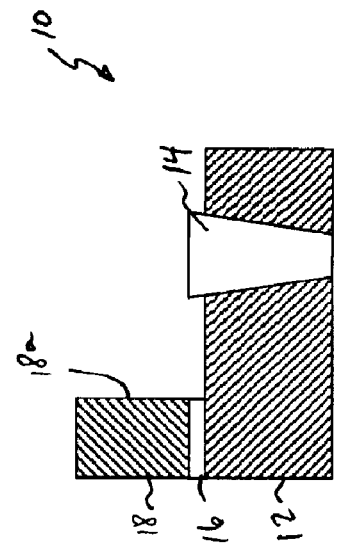

Referring now to FIG. 3, after the polysilicon layer 18 has been patterned, it is time to remove the hard mask 20. In the present example, a hydrofluoric acid (HF) etch 34 is provided. As stated above and discussed more fully below, the hard mask 20 is formed so that it has a relatively high HF etch rate. In the present embodiment, the hard mask 20 has a HF etch rate that is 20 or 30 times greater than the corresponding etch rate of a conventional thermal oxide film.

Figure 4:
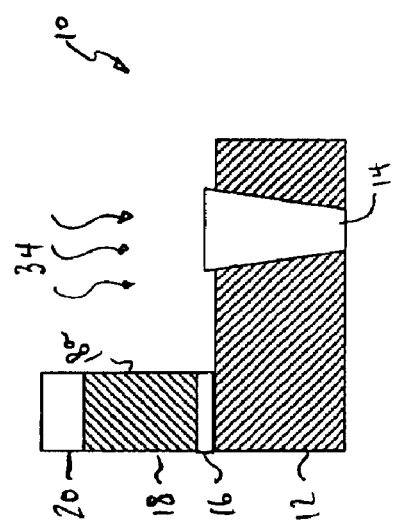

Referring now to FIG. 4, once the hard mask 20 is removed, there is little if any effect on the STI 14. This is because the etch rate of the filler material of the STI 14 is substantially lower than the etch rate of the hard mask 20, and any deformation (such as in the form of divots) in the STI are inconsequential. Also, the HF etch 34 has little effect (if any) on an exposed edge 18a of the pattern polysilicon layer 18. As a result, the patterned polysilicon layer 18 is of a uniform and predictable size and shape, there is little if any gate length variation, and there is little Si recess normally associated with a H3PO4 etch.

Figure 5:
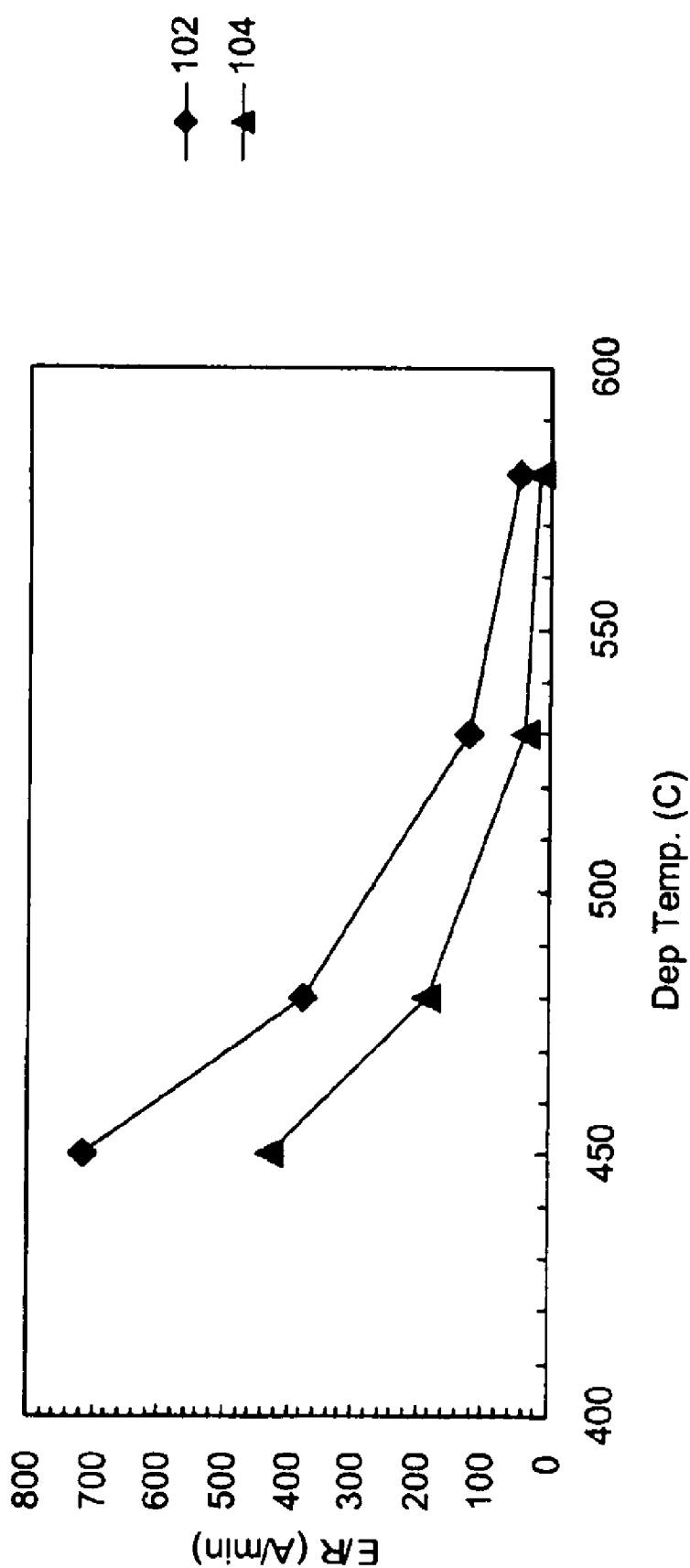
FIG. 5 is a graph comparing deposition temperature used for forming a nitride hard mask to the corresponding etch rate of the nitride hard mask in a dilute hydrofluoric acid.
Figure 6:
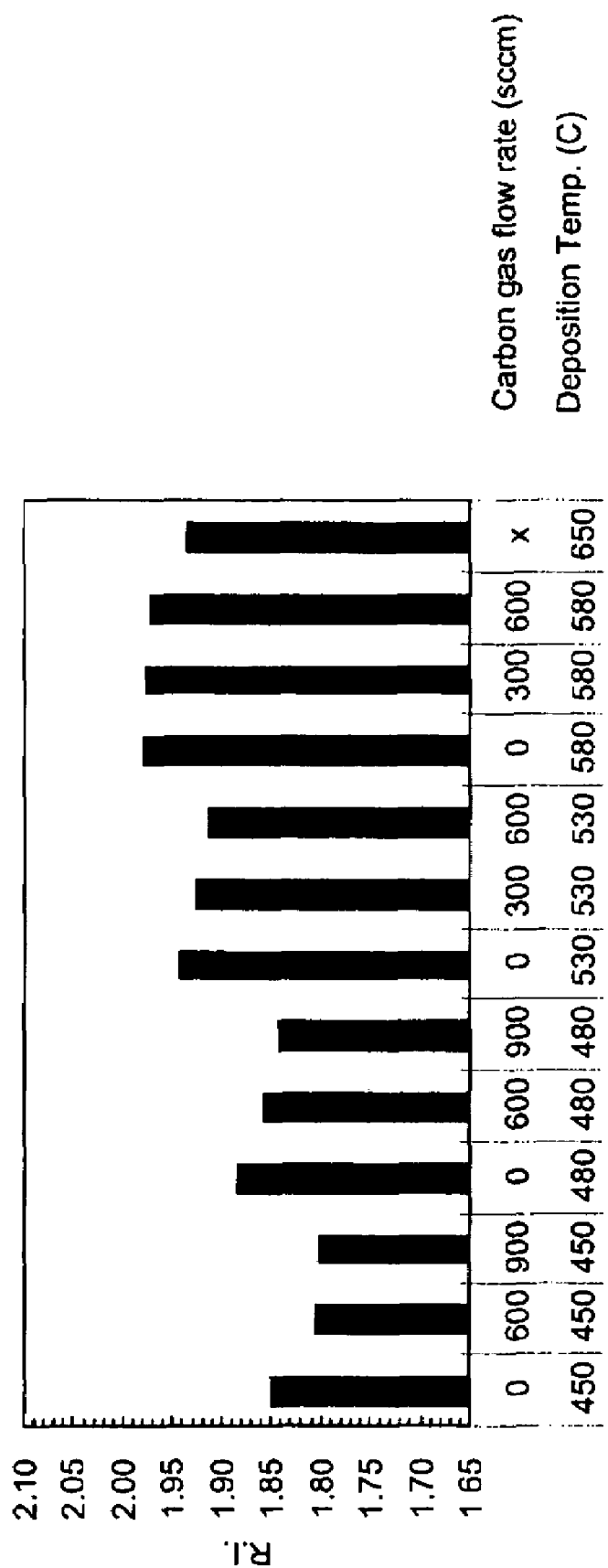
FIG. 6 is a graph showing deposition temperature and carbon gas flow rate used for forming a nitride hard mask to the corresponding reflective index of the nitride hard mask.

Referring now to FIGS. 5 and 6, an etch rate and a reflection index can be selected or "tuned" for the hard mask 20 for lithography optimization. Referring specifically to FIG. 5, a horizontal axis (Dep. Temp. (C)) defines a temperature range for the deposition of a SiN hard mask 20. A vertical axis (E/R (A/min)) defines a corresponding etch rate. For the sake of the present analysis, the etch rate is for a 49% concentration HF etch with a dilution ratio of HF:H2O of 1:100 done at room temperature. As a point of reference, the etch rate for silicon oxide in the present environment is about 30 A/min. A first curve 102 is for SiN without carbon doping and a second curve 104 is for SiN with carbon doping. As can be seen, at lower temperatures (e.g., less than about 500° C.), the etch rate of the hard mask 20 is very high, especially for the SiN without carbon doping.

Referring specifically to FIG. 6, a horizontal axis includes two values—a flow rate of Carbon (measured in sccm) listed above a deposition temperature (listed in ° C.). A vertical axis (R.I.) defines a corresponding reflection index for the SiN hard mask. As can be seen, the reflection index of the SiN hard mask is tunable by varying one or both of the deposition temperature and the amount of carbon. The reflection index of the SiN hard mask can be tuned to a specific amount, according to a desired value from other processing parameters.

For the sake of example, consider that a photolithography process used for patterning the photoresist layer 22 (FIG. 1) performs better when the hard mask 20 has a reflective index of 1.90. Given these parameters and the graphs of FIGS. 5 and 6, it can be seen that one solution is to have a deposition temperature of about 450° C. and no carbon doping. FIG. 5 shows that the resulting E/R rate is about 700 Angstroms per minute and FIG. 6 shows that the resulting refractive index is about 1.88. Another solution would be to have a deposition temperature of about 530° C. and a carbon gas flow rate of about 600 sccm. FIG. 5 shows that the resulting E/R rate is about 80 Angstroms per minute and FIG. 6 shows that the resulting refractive index is about 1.92. In the present example, it is also desirable to have the HF etch rate for the hard mask as high as possible, so the first solution (450° C. and no carbon doping) is the preferred process. It is understood, however, that the present example is simplified and that other parameters (such as the amount of carbon in the hard mask) may have different levels of importance in different processing environments.

Therefore, the present disclosure provides a method for forming a hard mask for gate electrode patterning in a semiconductor device. In one embodiment, the method forms the semiconductor device by overlying a polysilicon layer with a nitride hardmask. The nitride hardmask has a relatively high etch rate to hydrofluoric acid as compared to that of silicon oxide. The polysilicon is then patterned using the hardmask and the hardmask is subsequently removed.

In some embodiments, the etch rate of the hard mask in a dilute hydrofluoric acid is 3 and 60 times that of silicon oxide. In some embodiments, the etch rate of the hard mask in a dilute hydrofluoric acid is between about 100 Angstroms per minute to about 1000 Angstroms per minute.

In some embodiments, the step of forming the nitride hardmask includes doping the hardmask with carbon. The doping with carbon can be done at a flow rate tuned to a predetermined reflective index for the hardmask. The nitride hardmask can also be formed using a dopant from a group consisting of oxygen, chlorine, boron, hydrogen, germanium, and arsenic.

In some embodiments, the nitride hardmask includes a nitrogen concentration from about 10% to about 80%.

In another embodiment, a method for making a gate structure of a semiconductor device is provided. The method includes providing a substrate with at least one isolation structure including a first material that has an etch rate in dilute hydrofluoric acid that is less than 50 Angstroms per minute. A polysilicon layer is formed over the substrate and a hardmask is formed over the polysilicon. The hardmask includes a second material that has an etch rate in dilute hydrofluoric acid that is greater than 100 Angstroms per minute. The polysilicon layer is patterned using the hardmask and the hardmask is subsequently removed using a dilute hydrofluoric acid.

In another embodiment, a semiconductor device is provided. The semiconductor devices includes a substrate and a shallow trench in the substrate. The shallow trench is filled with an isolation material and has an upper surface that is divot-free. The shallow trench is positioned in the substrate so that at one time it is exposed during the fabrication of the semiconductor device during a hardmask removal process. The semiconductor device also includes a patterned polysilicon layer. The patterned polysilicon layer has a side edge that is relatively smooth and straight. The side edge is positioned so that at one time it is exposed during the fabrication of the semiconductor device during the hardmask removal process.

In some embodiments, the semiconductor the isolation material is a silicon oxide having a relatively low etch rate to dilute hydrofluoric acid.

Although only a few exemplary embodiments of this disclosure have been described in details above, those skilled in the art will readily appreciate that many modifications are possible in the exemplary embodiments without materially departing from the novel teachings and advantages of this disclosure. In one example, the layer 202 may be utilized for a dummy structure of a semiconductor device that contains at least one high-k device. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for forming a semiconductor device, comprising:
   providing a polysilicon layer to be etched;
   forming over the polysilicon layer, a nitride hardmask with a relatively high etch rate to dilute hydrofluoric acid as compared to the etch rate of silicon oxide;
   patterning the polysilicon layer using the hardmask; and
   thereafter removing the hardmask.

2. The method of claim 1 wherein the step of patterning the polysilicon layer exposes a silicon oxide structure.

3. The method of claim 1 wherein the etch rate of the hard mask in a dilute hydrofluoric acid is greater than three times that of the silicon oxide.

4. The method of claim 1 wherein the etch rate of the hard mask in a dilute hydrofluoric acid is about twenty times that of the silicon oxide.

5. The method of claim 1 wherein the etch rate of the hard mask in a dilute hydrofluoric acid is between about 100 Angstroms per minute to about 1000 Angstroms per minute.

6. The method of claim 1 wherein the step of forming the nitride hardmask includes doping the hardmask with carbon.

7. The method of claim 6 wherein the doping with carbon is done at a flow rate tuned to a predetermined reflective index for the hardmask.

8. The method of claim 1 wherein the nitride hardmask includes a nitrogen concentration from about 10% to about 80%.

9. A method for forming a semiconductor device, comprising:
   providing a polysilicon layer to be etched;
   forming over the polysilicon layer, a nitride hardmask with a relatively high etch rate to dilute hydrofluoric acid as compared to the etch rate of silicon oxide;
   patterning the polysilicon layer using the hardmask; and
   thereafter removing the hardmask, wherein forming the nitride hardmask utilizes a dopant from a group consisting of carbon, oxygen, chlorine, boron, hydrogen, germanium, and arsenic.

10. The method of claim 1 wherein the nitride hardmask has a thickness between about 10 nanometers and about 200 nanometers.

11. The method of claim 1 wherein forming the nitride hardmask is performed at a temperature less than 630° C.

12. The method of claim 1 wherein the step of removing the hardmask is performed with a hydrofluoric acid.

13. The method of claim 12 wherein the hydrofluoric acid is diluted to a ratio of about 49% HF:H2O =1:100.

14. A method for making a gate structure of a semiconductor device, comprising:
   providing a substrate with at least one isolation structure including a first material that has an etch rate in dilute hydrofluoric acid that is less than 50 Angstroms per minute;
   forming a first layer over the substrate;
   forming a hardmask over the first layer, the hardmask including a second material that has an etch rate in dilute hydrofluoric acid that is greater than 100 Angstroms per minute;
   patterning the first layer using the hardmask; and
   removing the hardmask using a dilute hydrofluoric acid.

15. The method of claim 14 further comprising:
   providing a gate oxide between the substrate and the polysilicon layer.

16. The method of claim 14 wherein the hardmask is a single film including nitrogen.

17. The method of claim 14 wherein the hardmask is a film formed of silicon nitride and the method further comprises:
   doping the hardmask during formation with carbon.

18. The method of claim 17 further comprising:
   determining a reflective index for the hardmask; and
   selecting a flow rate for the carbon doping based on the selected reflective index.

19. The method of claim 17 wherein the first material is silicon oxide and the second material is silicon nitride.

20. The method of claim 17 wherein the first layer is a polysilicon layer.

* * * * *